United States Patent
Zhou et al.

[11] Patent Number: 5,930,627
[45] Date of Patent: Jul. 27, 1999

[54] PROCESS IMPROVEMENTS IN SELF-ALIGNED POLYSILICON MOSFET TECHNOLOGY USING SILICON OXYNITRIDE

[75] Inventors: Mei Sheng Zhou; Sheau-Tan Loong; Koon Lay Denise Tan; Jian Xun Li; Wing Hong Chiu; Kok Hiang Stephanie Tang, all of Singapore, Singapore

[73] Assignee: Chartered Semiconductor Manufacturing Company, Ltd., Singapore, Singapore

[21] Appl. No.: 08/851,403

[22] Filed: May 5, 1997

[51] Int. Cl.⁶ .............................. H01L 21/8247
[52] U.S. Cl. .......................... 438/257; 438/786; 438/303
[58] Field of Search ................... 438/257–267, 438/301, 303, 305, 786

[56] References Cited

U.S. PATENT DOCUMENTS

| | | |
|---|---|---|
| 4,871,689 | 10/1989 | Bergami et al. |
| 4,901,133 | 2/1990 | Curran et al. |
| 5,120,671 | 6/1992 | Tang et al. ............................. 437/43 |
| 5,208,472 | 5/1993 | Su et al. ................................. 257/344 |
| 5,286,667 | 2/1994 | Lin et al. ................................ 437/52 |
| 5,492,853 | 2/1996 | Jeng et al. ............................. 437/60 |
| 5,534,455 | 7/1996 | Liu . |
| 5,643,833 | 7/1997 | Tsukamoto . |
| 5,736,442 | 4/1998 | Mori ...................................... 438/257 |

OTHER PUBLICATIONS

S. Wolf, "Silicon Processing for the VLSI Era" vol. 2, Lattice Press, Sunset Beach, CA (1990), p143.
Wolf et al, "Silicon Processing for the VLSI Era" vol. 1, Lattice Press (1986), p195.
Ghandhi, "VLSI Fabrication Principles" 2nd Edition, A Wiley–Interscience Publication, p484–5, Date Unknown.

*Primary Examiner*—Richard A Booth
*Attorney, Agent, or Firm*—George O. Saile; Stephen B. Ackerman

[57] ABSTRACT

Silicon enriched silicon oxynitride is used in applications both as an independent etch stop and as a cap layer and sidewall component over polysilicon gate electrodes in order to prevent insulator thinning and shorts caused by a mis-aligned contact mask. In one embodiment a silicon enriched silicon oxynitride layer is placed over a polysilicon gate with conventional sidewalls and insulative cap. In another embodiment the insulative cap and the sidewalls are formed of a silicon enriched silicon oxinitride. Etching of contact openings in the subsequently deposited insulative layer is suppressed by the silicon enriched silicon oxynitride if it is engaged because of a mis-aligned contact mask. In another embodiment a polysilicon stack edge of a memory device is protected by a conformal silicon oxynitride layer during etching of a self-aligned-source (SAS) region. These embodiments are accomplished with minimal and virtually negligible increase in process complexity or cost.

18 Claims, 6 Drawing Sheets

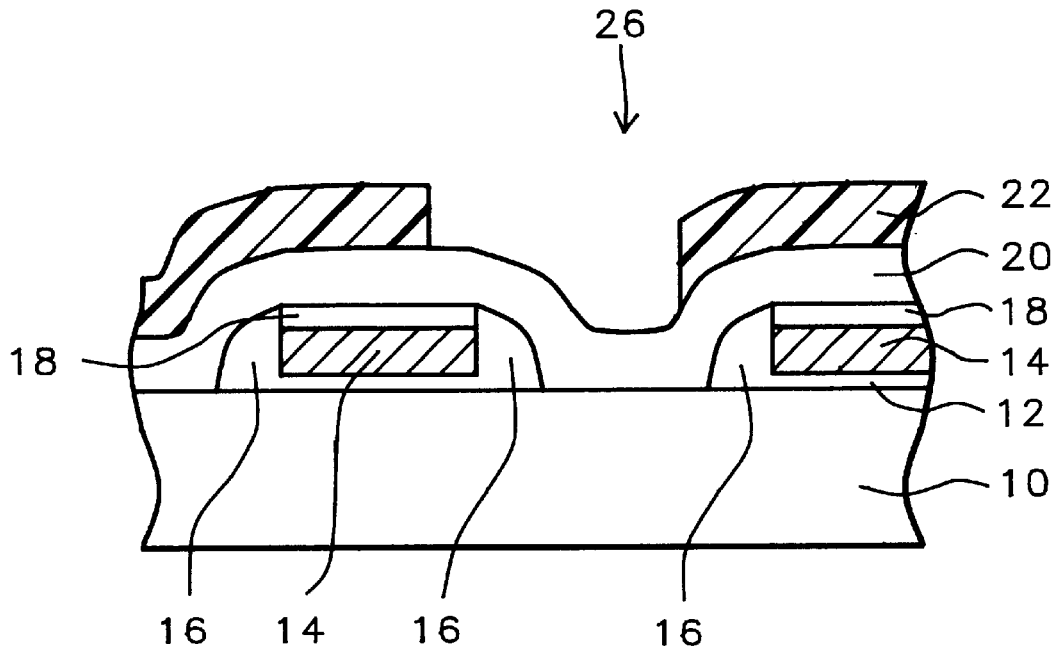
FIG. 1 – Prior Art
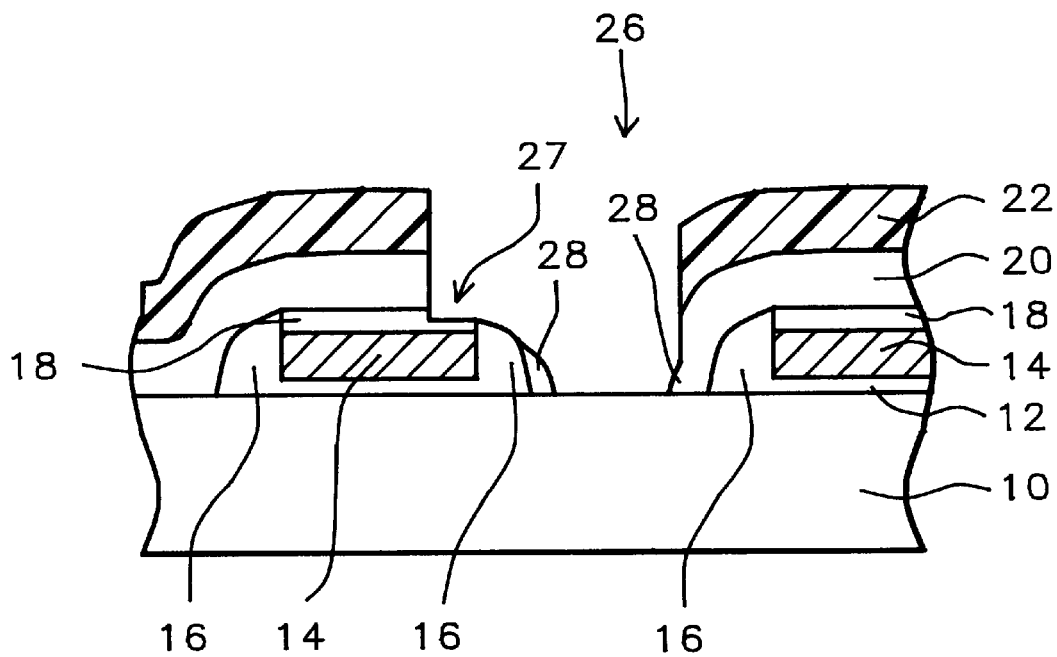
FIG. 2 – Prior Art

PROCESS IMPROVEMENTS IN SELF-ALIGNED POLYSILICON MOSFET TECHNOLOGY USING SILICON OXYNITRIDE

BACKGROUND OF THE INVENTION (1) Field of the Invention

The invention relates to processes for the manufacture of semiconductor devices and more particularly to the use of thin silicon oxynitride layers to shield select portions of MOSFET device structures against etchants.

(2) Description of Prior Art

The fabrication of integrated circuit chips comprises the formation of semiconductor devices within the surface of a single crystalline silicon wafer. The semiconductive elements of metal-oxide-silicon-field-effect-transistors (MOSFETs) are contained within the surface of the single crystalline substrate wafer and are formed by ion-implantation using the control electrode, a polysilicon gate formed over the substrate, as an implantation mask. The source and drain regions of the MOSFET are thereby self-aligned to the gate electrode.

Many variations of this principle of self alignment to the polysilicon gate have been developed to improve device performance and stability, in particular, the use of side walls on the edges of the polysilicon gate have permitted the tailoring of source and drain diffusions at the ends of the channel region to control short channel effects. These advances in MOSFET processing have resulted in high performance sub-micron sized devices of many types. The lightly-doped-drain (LDD) structure, used universally in sub-micron MOSFET technology, is a notable example of this side-wall tailoring.

The use of insulative sidewalls and caps over polysilicon conductors has also permitted the formation of self-aligned contacts to MOSFET active elements. Self-alignment processing utilizes reactive-ion-etching (RIE) to anisotropically etch vertical walled openings, typically through insulative layers, such as silicon oxide and various silicate glasses.

Self-aligned-contacts can be made in various configurations. Typically an insulative sidewall is provided along the edge of the polysilicon gate electrode. The sidewall provides an insulative spacing between the contact and the polysilicon gate. A metal such as platinum or titanium is deposited over the wafer. Annealing causes the metal to react with the exposed silicon forming a silicide contact. Afterwards, un-reacted metal is etched away leaving the silicide which is then connected to metallization. This is known as the salicide process and is discussed in detail by Wolf, S., "Silicon Processing for the VLSI Era", Vol. 2, Lattice Press, Sunset Beach, Calif., (1990),p143ff.

After a salicide contact is formed an insulative layer is deposited and openings are etched to access the contact. In very dense geometries the sidewalls assist in maintaining sufficient insulative spacing between the source/drain contact and the polysilicon gate. However, mis-alignment of the contact mask can lead to penetration of insulative material over the gate electrode leading to shorts bridging between the gate electrode and the source/drain.

FIG. 1 and FIG. 2 illustrate the formation of a contact opening to a source or drain of a polysilicon gate MOSFET with a contact mask mis-alignment using a conventional process. In FIG. 1 the cross section of a polysilicon gate 14 located over a gate oxide 12 on a wafer 10 is shown before the contact etch is performed. A cap oxide layer 18 is over the polysilicon and an inter-polysilicon-oxide layer (IPO) 20 has been deposited. A contact opening 26 defined by the mis-aligned photoresist mask 22 is to be made to access the active silicon area. The figures illustrates the contact opening 26 to be made between adjacent polysilicon gates although the structure to the right of the contact opening 26 could as well be field oxide isolation. The sidewalls 16, typically formed of silicon oxide, place the downward curvature of the IPO layer laterally away from the polysilicon element 14, thereby spacing the contact away from it. FIG. 2 shows the contact opening after the IPO layer has been etched by RIE. The mis-alignment of the photoresist mask results in penetration 27 of the cap oxide 18 posing a potential short. Additional sidewall portions 28 are formed which can be reduced only by over etching.

Su, et.al., U.S. Pat. No. 5,208,472 cites the use of dual spacers alongside the polysilicon gate electrode. the first spacer is used to define the source/drain implant and the second spaces a silicide contact further away from the gate electrode, thereby reducing gate-to-source/drain bridging. The spacers may be of silicon oxide or silicon nitride.

Lin, et.al., U.S. Pat. No. 5,286,667 cites the use of silicon nitride or silicon oxynitride to form an additional cap over the cap oxide 18. In addition, a thin layer of silicon nitride or oxynitride is used as an etch stop during the etching of a contact opening in a sacrificial borophosphosilicate glass (BPSG) layer. The etching is performed using both dry and wet etching. Although the isotropic wet etching undercuts the BPSG, this is of no consequence in Liu et.al.'s application since the remainder of this layer is subsequently removed.

In applications wherein the BPSG layer constitutes the IPO and the device geometries are in the sub-micron range, wet etching or isotropic dry etching is generally not permissible. Thus, substantial over etching by the RIE step may be required in order to properly remove the IPO within the contact opening. This requirement is best served by either forming the sidewall and polysilicon cap from a material having a high etch resistance to the RIE or by protecting them by a layer of such material. The material taught by this invention is a silicon oxynitride having a high silicon content. This material has a substantially superior etch resistance over silicon nitride and conventional silicon oxynitrides.

Tang et.al. U.S. Pat. No. 5,120,671 teaches a process for forming a self-aligned source region in a flash EEPROM (electrically-erasable-programmable-read-only-memory) device. A composite polysilicon stack is formed which comprises, not only conductive lines, but also storage elements of the EEPROM including an additional polysilicon layer and thin dielectric layers. The polysilicon stack is used to mask the etching of a field oxide region, resulting in a common self-aligned-source (SAS) unencumbered by field oxide encroachment. Liu U.S. Pat. No. 5,534,455 addresses the problem of silicon gouging and tunnel oxide undercutting by the SAS etch by performing the SAS etch after spacer formation. The spacer protects the edges of the polysilicon stack from attack by the SAS etch. The process taught by this invention provides comparable protection with less processing and is thereby more cost effective.

SUMMARY OF THE INVENTION

It is an object of this invention to provide an improved method for reducing the incidence of shorts between polysilicon gate electrodes and adjacent contact structures caused by contact mask mis-alignment.

It is another object of this invention to provide an effective bottom anti-reflective coating(BARC) layer over polysilicon gate electrodes for contact opening lithography.

It is yet another object of this invention to disclose a silicon rich, non-stoichiometric, silicon oxynitride composition which, by virtue of its high silicon content, has a high dielectric constant and a plasma etching resistance superior to that of silicon nitride or any of the conventional silicon oxynitrides.

These objects are accomplished by depositing a thin conformal layer of a silicon rich silicon oxynitride over the polysilicon gate structure immediately prior to the deposition of an inter-polysilicon-oxide (IPO) or an inter-level-dielectric (ILD) layer. This layer provides an effective etch stop for the IPO contact etch, thereby preventing penetration of the polysilicon gate cap oxide and the sidewall structure. The silicon rich silicon oxynitride composition taught by this invention provides an etch rate selectivity with respect to silicon oxide superior to that of silicon nitride and therefore is a more effective etch stop.

In an alternate embodiment, these objects are accomplished by forming, the polysilicon cap layer and the sidewall structures of a silicon rich silicon oxynitride. Not only is the silicon oxynitride formulation taught by this invention, a reliable etch stop, preventing over etch of the cap layer, but its high dielectric constant suppresses the maximum intensity of the electric field in the LDD region under the sidewall. This advantageous effect of a high dielectric constant material in the sidewall has been demonstrated by Mizuno U.S. Pat. No. 5,119,152.

It is another object of this invention to protect a polysilicon stack from edge undercut during self-aligned source etching, particularly in the manufacture of EEPROMs.

This object is accomplished by depositing a thin conformal layer of silicon oxynitride over the polysilicon stack immediately prior to SAS etching. The layer prevents undercutting of the elements of the polysilicon stack, particularly the tunnel oxide at its base. The formation and of the layer accomplished with minimal increase in process complexity or cost.

BRIEF DESCRIPTION OF THE DRAWINGS

FIG. 1 is a cross sectional view of a prior art polysilicon gate MOSFET with an improperly aligned contact photomask before contact etch.

FIG. 2 is a cross sectional view of a prior art polysilicon gate MOSFET with an improperly aligned contact photomask after contact etch.

DESCRIPTION OF THE PREFERRED EMBODIMENTS

In a first preferred embodiment of this invention a silicon oxynitride layer is used as an etch stop to protect an insulative layer over a polysilicon gate electrode from shorting to a contact if a contact mask mis-alignment occurs. The figures used to illustrate the first, second, and third embodiments show a contact opening being made between two adjacent polysilicon gates although the polysilicon gate to the right of the contact opening in each figure could as well be replaced by field oxide isolation.

Figure 3:
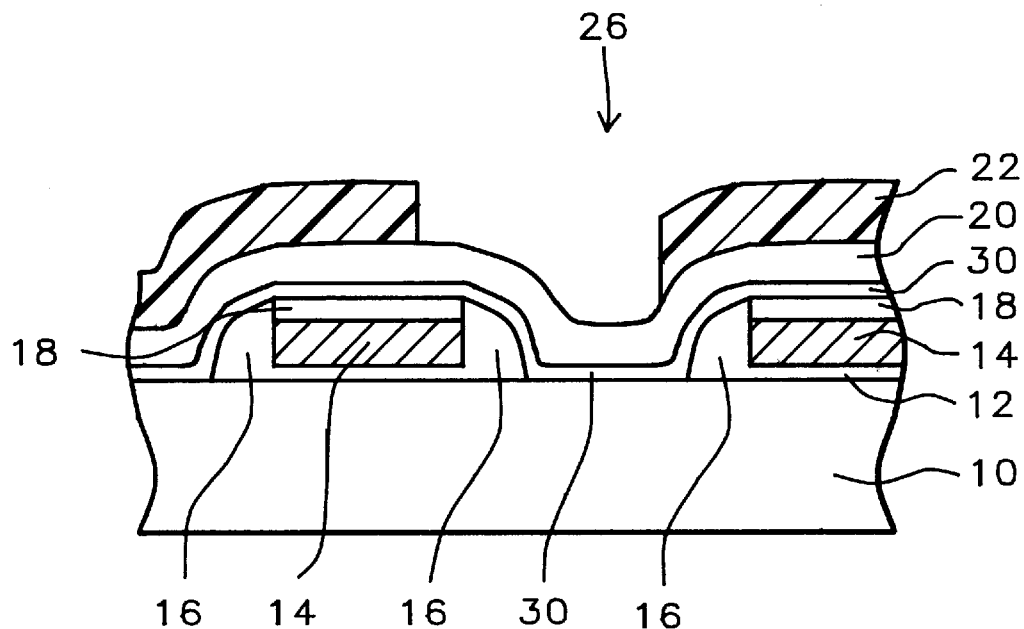
FIG. 3 is a cross section of a polysilicon gate MOSFET with an improperly aligned photoresist contact mask before contact etch using a silicon oxynitride etch stop layer according to the teaching the present invention.

Referring to FIG. 3, a first embodiment of this invention is described. A silicon wafer having a polysilicon gate 14 located over a gate oxide 12 on a wafer 10 is shown before the contact etch is performed. A cap oxide layer 18 is formed over the polysilicon gate 14. This layer 18 is nominally 1,000 to 3,000 Angstroms thick and is formed by chemical-vapor deposition (CVD). The sidewalls 16, typically formed of silicon oxide, are formed by depositing a conformal layer of silicon oxide and then etching it back anisotropically using RIE. Although their application is usually part of the well known process for forming the lightly-doped-drain (LDD) structure, they provide an additional benefit during contact formation by spacing the contact away from the polysilicon gate and the LDD region.

A conformal layer of silicon oxynitride 30 is deposited over the wafer. The layer 30 is deposited by PECVD at a temperature of between about 300° C. and 400° C. The thickness of the Silicon oxynitride layer for this embodiment is between about 300 and 350 Angstroms. The layer 30 is deposited using $SiH_4$, $N_2O$, with a He carrier gas. The flow rate of $SiH_4$ is kept between 80 and 90 SCCM. The flow rate of $N_2O$ is between about 80 and 100 SCCM, and the He carrier gas is flowed to maintain a pressure within the PECVD reactor of between about 3,000 and 8,000 mTorr. Under these conditions a silicon oxynitride layer having the composition: Si-approximately 52%; O-approximately 20%; N-approximately 10%; and H-approximately 18% is obtained.

Silicon oxynitride films generally have characteristics between those of silicon oxide and silicon nitride and have the empirical formula $SiO_xN_y(H_z)$. Wolf, S. and Tauber, R.N., "Silicon Processing for the VLSI Era", Vol.1, Lattice Press, Sunset Beach, Calif., (1986),p195. Accordingly, the values of X,Y, and Z of the silicon oxynitride layer formed under the conditions of this invention are approximately 0.66, 0.33, and 9 respectively. This corresponds to a silicon enriched non-stoichiometric composition.

This composition has a dielectric constant of approximately 10, which is higher than that of silicon nitride (7.5) and silicon oxide (3.85), and exhibits the etching selectivities given in Table I. As can be seen in the table the selectivities of silicon oxynitride formed by the process of the invention are approximately an order of magnitude greater than silicon nitride. This advantage allows for a sizeable reduction of layer thickness without compromising the etch stopping property of the layer.

TABLE I

Etch Rate Selectivities of Silicon Oxynitride formed according to this invention and Silicon Nitride as applicable to Contact Opening RIE.

| | Etch rate Selectivity | |
|---|---|---|
| Material Etched | $SiO_xN_y(H_z)$ | $Si_3N_4$ |
| $SiO_2$(IPO) | 14:1 | 1.3:1 |
| Si | 1.4:1 | 0.14:1 |

The dielectric constant obtainable by parametric variation of this deposition process ranges from about 7.5 to 11.9. The remarkable properties of this silicon oxynitride composition, such as the high dielectric constant and the improved etch rate selectivities, are attributed to its high silicon content. Table I shows, that the silicon oxynitride composition taught by this invention is considerably superior to silicon nitride as an etch stop.

Figure 4:
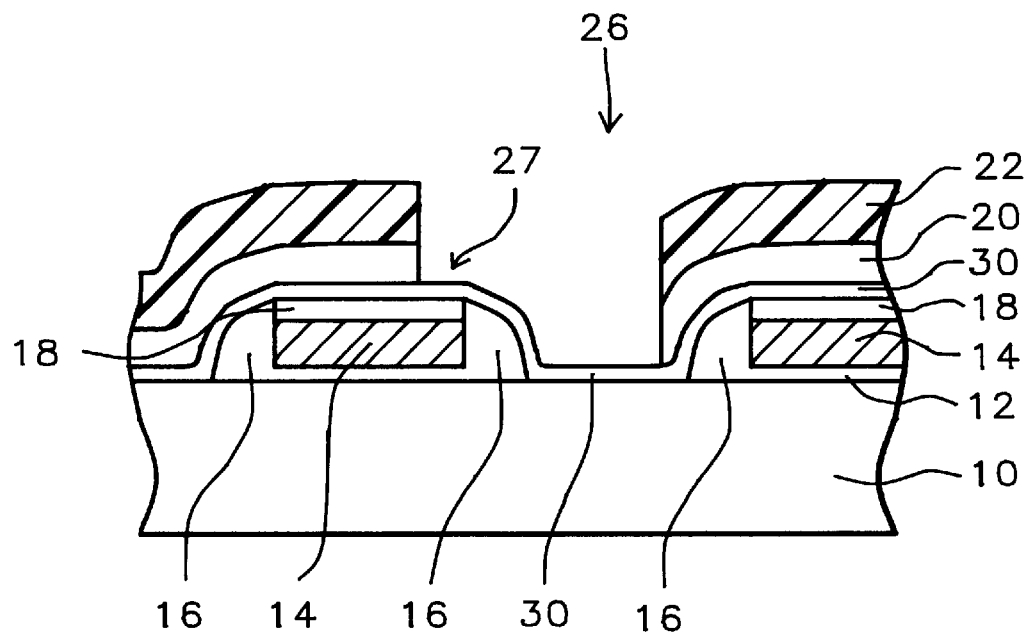
FIG. 4 is a cross section of polysilicon gate MOSFET with an improperly aligned contact opening after contact etch using a silicon oxynitride etch stop layer according to the teaching the present invention.
Figure 5:
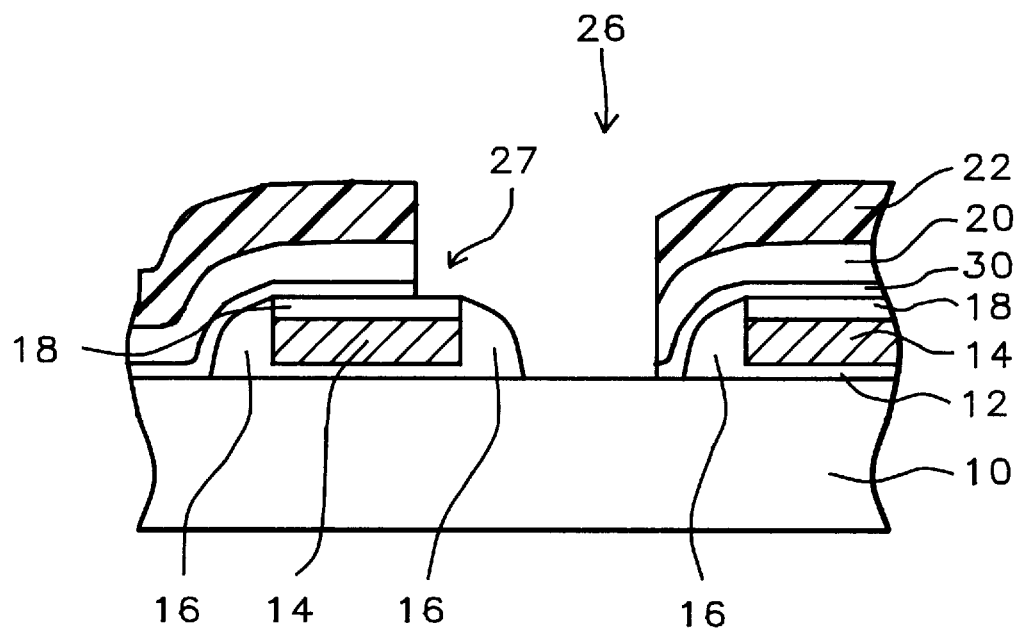
FIG. 5 is a cross section of a polysilicon gate MOSFET with an improperly aligned contact opening after removal of a silicon oxynitride etch stop layer according to the teaching the present invention.

An IPO layer 20 having a thickness of between about 1,000 and 3,000 Angstroms is deposited over the Silicon oxynitride layer. A photoresist mask 22 is deposited and patterned to define a contact opening 26. The mask opening in FIG. 3 is deliberately shown to be mis-aligned so that the benefit of the Silicon oxynitride layer 30 may be understood. The wafer is next subjected to RIE using well known fluorocarbon etchants to form a contact opening in the IPO layer. FIG. 4 shows the cross section of the device after this operation. The Silicon oxynitride layer 30 prevents any penetration of the cap oxide 18 by the contact etch, thereby maintaining sufficient insulative material in the region 27 to prevent the development of a short after the opening 26 is subsequently filled with conductive material. After completion of the IPO etch the Silicon oxynitride remaining in the opening 26 is removed by conventional dry etching using fluorocarbon etchant gases.

Figure 6:
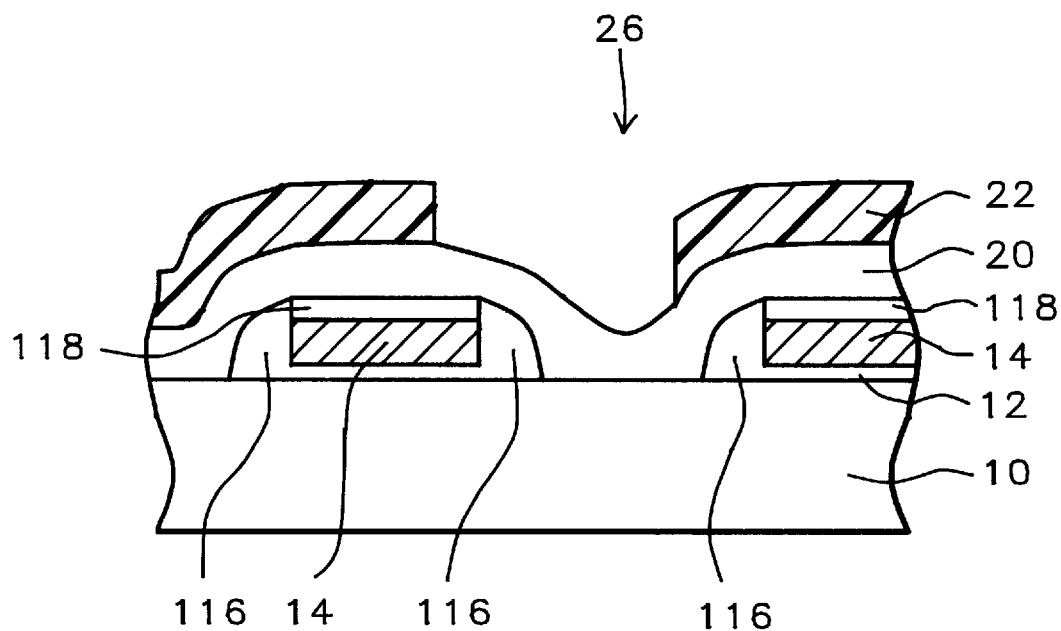
FIG. 6 is a cross section of polysilicon gate MOSFET with an improperly aligned photoresist contact mask before contact etch using a polysilicon cap and sidewall structure formed of silicon oxynitride according to the teaching the present invention.
Figure 7:
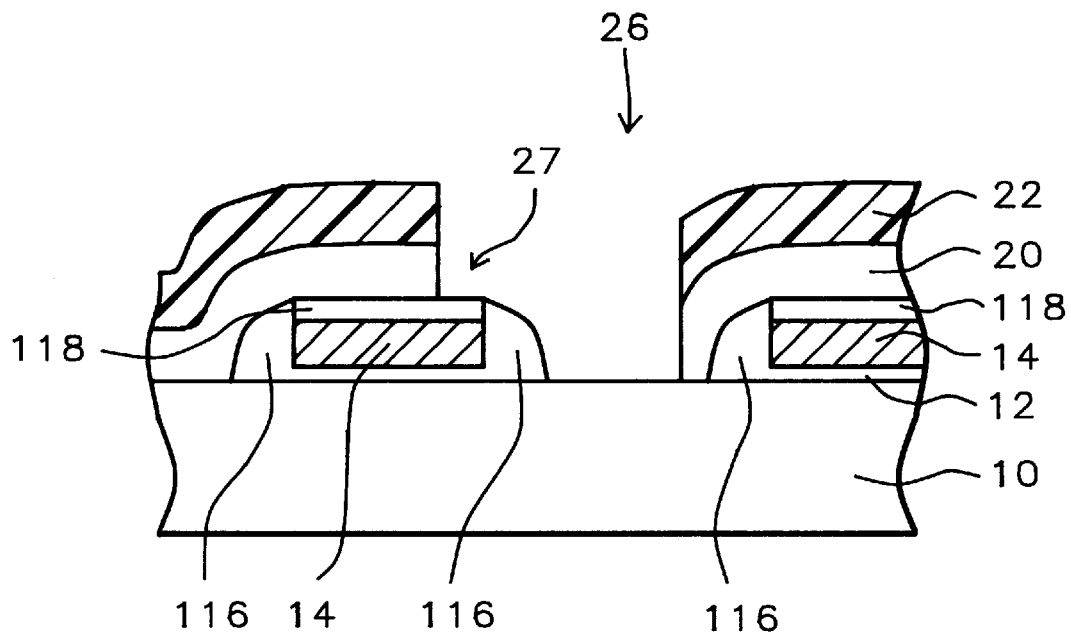
FIG. 7 is a cross section of a polysilicon gate MOSFET with an improperly aligned contact opening after its formation by RIE, using a polysilicon cap and sidewall structure formed of silicon oxynitride according to the teaching the a present invention.

In a second embodiment silicon oxynitride is used in place of silicon oxide for both the cap insulator and the sidewall insulator in the structure of the first embodiment. Referring to FIG. 6 the cap insulator 118 and the sidewalls 116 are formed of the silicon oxynitride composition described in the first embodiment. The figure shows a misalignment of the contact photoresist mask. The subsequent etching of the contact opening through the IPO layer 20 is accomplished in the same fashion as in the first embodiment. The resultant cross section is shown in FIG. 7. The high etch rate selectivity of the silicon enriched silicon oxynitride permits sufficient over-etch latitude to reduce or eliminate extra sidewalls derived from the IPO. This can be advantageous at very small design dimensions. Since silicon oxynitride is not formed in the contact region, the silicon oxynitride removal step of the first embodiment is not required.

Figure 8:
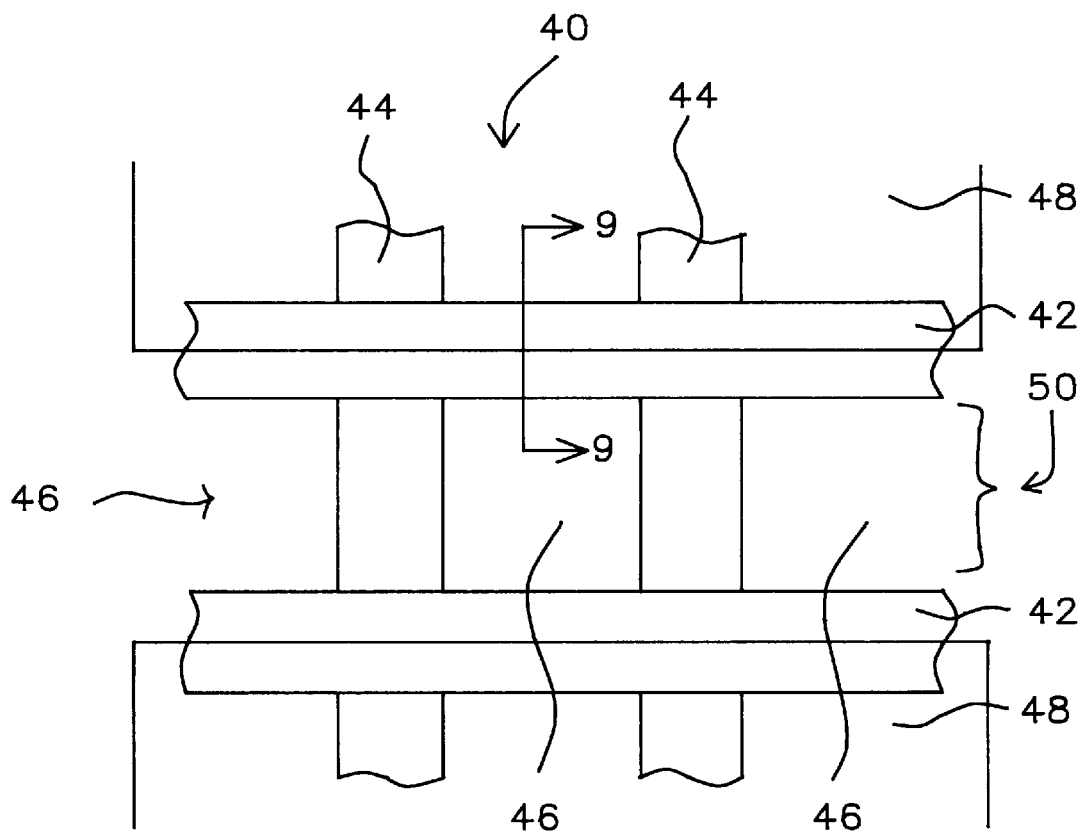
FIG. 8 is a plan view of an EEPROM prior to etching of field oxide.

Referring to FIG. 8 there is shown a plan view of a portion 40 of an EEPROM at a point in manufacture, using a conventional process, preceding the etching of field oxide in preparation for the implantation of the SAS. Bands 42 of a polysilicon stack consisting of multiple polysilicon and insulative layers have been formed over alternating regions of field oxide 44 and active silicon surface 46. A photoresist mask 48 exposes portions of the field oxide in the central part of the figure 50 which are to be etched away.

The SAS is then implanted into this region 50. The field oxide is between about 3,000 and 6,000 Angstroms thick and requires an amount of over etch to assure complete removal of the oxide. During this RIE step the walls of the polysilicon stack lie exposed. In addition the silicon surface in the regions 46 suffers exposure during the entire etching period, resulting in some removal of silicon.

Figure 9A:
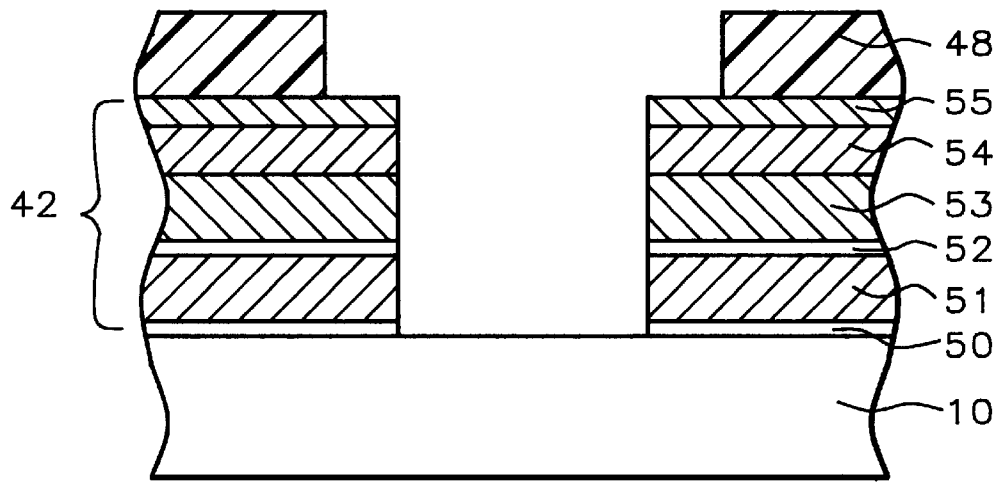
FIG. 9A is a cross section of an EEPROM taken along the line 9-9' of FIG. 8 before performing the SAS etch of the field oxide.

FIG. 9A is a cross section of the portion 9-9' of FIG. 8 showing the structure of the polysilicon stack 42 and the photoresist mask 48 before the SAS RIE. The field oxide portions lie above and below the plane of the page. The components of the polysilicon stack 42 are a thin tunnel oxide 50, a first polysilicon layer 51, a dielectric layer comprising $SiO_2$—$Si_3N_4$—$SiO_2$ (ONO) 52, a second polysilicon layer 53, a layer of tungsten silicide 54 and a cap layer of polysilicon 55.

Figure 9B:
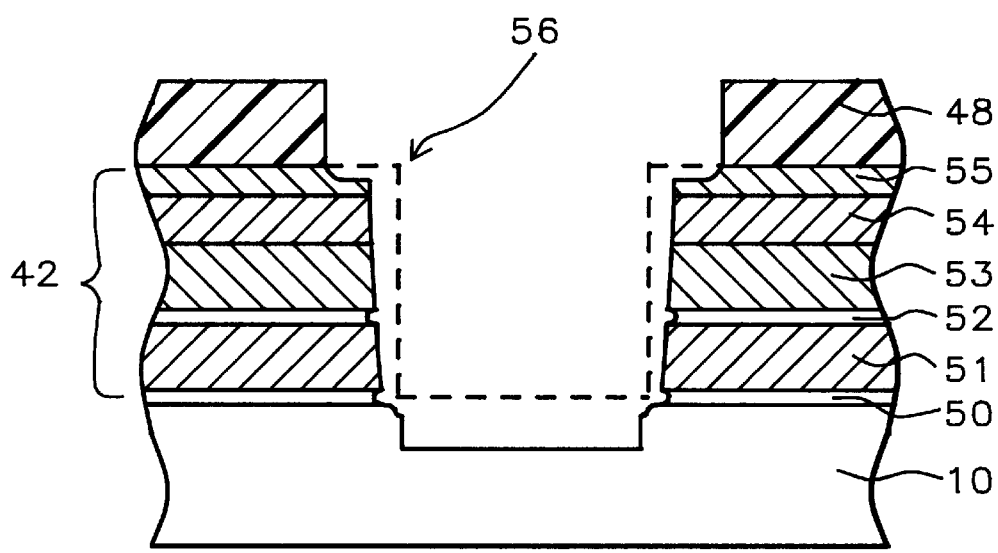
FIG. 9B is a cross section of an EEPROM taken along the line 9-9' of FIG. 8 after performing the SAS etch of the field oxide using a prior art process.

After etching the field oxide by the conventional process, there exists considerable erosion of the edges of the polysilicon stack 42, in particular, in the region of the tunnel oxide 50 and the ONO layer 52. This is shown in the cross section of FIG. 9B where the dashed line 56 represents the original profile. Erosion and undercutting of the tunnel oxide adversely affects the device characteristics.

Figure 9C:
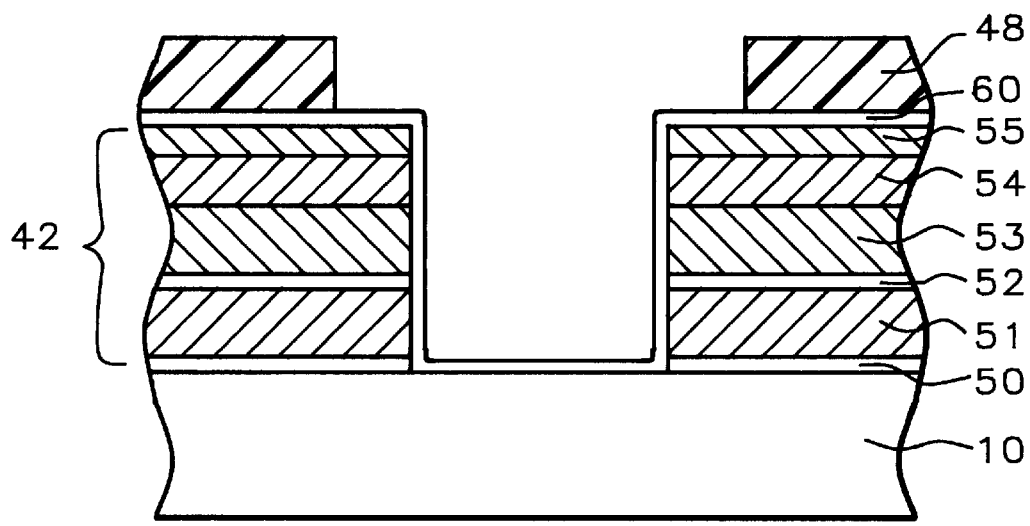
FIG. 9C is a cross section of an EEPROM taken along the line 9-9' of FIG. 8 before performing the SAS etch of the field oxide using the process taught by this invention.

In a third embodiment of this invention a Silicon oxynitride layer is used to protect the sidewall of a polysilicon stack during the etching of field oxide in the formation of the self-aligned-source (SAS) of an EEPROM. Referring to FIG. 9C there is again shown a cross section of the EEPROM in FIG. 8 represented by the line 9-9'. The Silicon oxynitride layer 60, between about 200 and 1,000 Angstroms thick, is deposited over the substrate wafer after the polysilicon stack 42 is completed and prior to the deposition of the photoresist for the SAS block-out mask 48. This conformal layer 60 protects the edges of the polysilicon stack from erosion by the SAS RIE. The Silicon oxynitride layer 60 is deposited in the same manner as in the first embodiment.

Figure 9D:
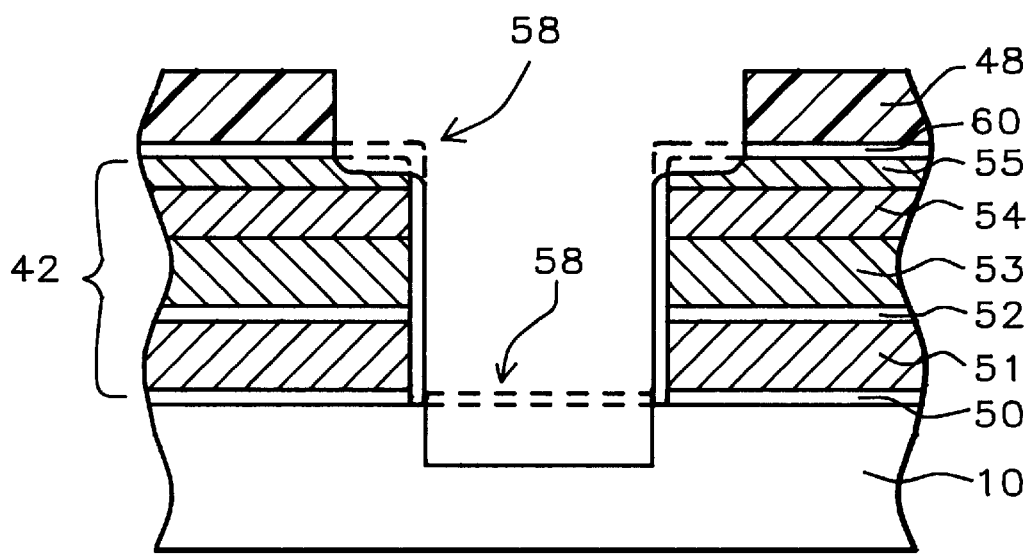
FIG. 9D is a cross section of an EEPROM taken along the line 9-9' of FIG. 8 after performing the SAS etch of the field oxide using the process taught by this invention.

Shown in FIG. 9D after the SAS etch, the sides of the polysilicon stack remain intact. Some of the silicon at the base of the opening is lost but the tunnel oxide 50 is not eroded or undercut. The dotted lines 58 denote the original profile.

Layers of Silicon oxynitride deposited by CVD techniques typically introduce an interfacial stress. This stress can cause adverse effects. In such cases the application of the Silicon oxynitride layer can be tailored to distribute and thereby diminish this stress. This is easily accomplished in any of the embodiments by beginning the CVD deposition process with the deposition of $SiO_2$ and then, by adjusting flow rates of the precursor gases, blend the layer to the Silicon oxynitride composition.

While the invention has been particularly shown and described with reference to the preferred embodiments thereof, it will be understood by those skilled in the art that various changes in form and details may be made without departing from the spirit and scope of the invention.

What is claimed is:

1. A method for forming a contact to a semiconductor element adjacent to a gate electrode comprising:

(a) providing a silicon wafer having a conductive gate electrode with a superjacent insulative cap layer and a subjacent gate insulative layer, said gate electrode also having an insulative sidewall structure and an active semiconductor element within the surface of said silicon wafer adjacent to said sidewall structure;

(b) depositing a silicon enriched silicon oxynitride layer over said silicon wafer;

(c) depositing an insulative layer over said silicon enriched silicon oxynitride layer;

(d) depositing a photoresist layer over said insulative layer;

(e) patterning said photoresist layer to define a contact opening;

(f) etching said insulative layer with a unidirectional etching technique, thereby exposing said silicon enriched silicon oxynitride layer;

(g) etching said silicon enriched silicon oxynitride layer thereby forming said contact opening; and (h) depositing a conductive material into said contact opening.

2. The method of claim 1 wherein said silicon enriched silicon oxynitride layer is deposited by PECVD at a temperature of between about 320° C. and 380° C. and pressure of between about 3,000 and 8,000 mTorr, using precursors $SiH_4$ at a flow rate of between about 80 and 90 SCCM and $N_2O$ at a flow rate of between about 80 and 100 SCCM in a helium carrier gas at a flow rate of between about 2,000 and 2,500 SCCM.

3. The method of claim 1 wherein said silicon enriched silicon oxynitride layer is between about 200 and 1,000 Angstroms thick.

4. The method of claim 1 wherein said silicon enriched silicon oxynitride layer contains a silicon oxide portion in its base.

5. The method of claim 1 wherein said insulative layer is selected from the group consisting of silicon oxide, a phosphosilicate glass, and a borophosphosilicate glass.

6. The method of claim 1 wherein said unidirectional etching technique is reactive-ion-etching using an etchant containing $CF_4$, $CHF_3$, and Argon.

7. The method of claim 1 wherein said silicon enriched silicon oxinitride layer is etched by reactive ion etching.

8. A method for forming a contact to a semiconductor element adjacent to a gate electrode comprising:

(a) providing a silicon wafer having a gate insulative layer subjacent to a doped polysilicon layer;

(b) depositing a first silicon enriched silicon oxynitride layer over said silicon wafer;

(c) depositing and patterning a first photoresist layer to define a gate electrode;

(d) anisotropically etching said first silicon enriched silicon oxynitride layer and said doped polysilicon layer;

(e) implanting a first dose of impurity atoms;

(f) depositing a second silicon enriched silicon oxynitride layer;

(g) anisotropically etching said second silicon enriched silicon oxynitride layer thereby forming sidewalls;

(h) implanting a second dose of impurity atoms thereby forming a semiconductor element;

(i) depositing an insulative layer over said silicon wafer;

(j) depositing a second photoresist layer over said insulative layer;

(k) patterning said second photoresist layer to define a contact opening;

(l) etching said insulative layer with a unidirectional etching technique, thereby forming said contact opening; and (m) depositing a conductive material into said contact opening.

9. The method of claim 8 wherein said first and said second silicon enriched silicon oxynitride layers are deposited by PECVD at a temperature of between about 320° C. and 380° C. and pressure of between about 3,000 and 8,000 mTorr, using precursors $SiH_4$ at a flow rate of between about 80 and 90 SCCM and $N_2O$ at a flow rate of between about 80 and 100 SCCM in a helium carrier gas at a flow rate of between about 2,000 and 2,500 SCCM.

10. The method of claim 8 wherein said first silicon enriched silicon oxynitride layer is between about 200 and 1,000 Angstroms thick.

11. The method of claim 8 wherein said first and said second silicon enriched silicon oxynitride layers contain a silicon oxide portion in their base.

12. The method of claim 8 wherein said first and said second silicon enriched silicon oxynitride layers are etched by reactive-ion-etching.

13. The method of claim 8 wherein said insulative layer is selected from the group consisting of silicon oxide, a phosphosilicate glass, and a borophosphosilicate glass.

14. The method of claim 8 wherein said anisotropic etching technique is reactive-ion-etching.

15. A method of protecting a stacked gate edge on a semiconductor device to minimize erosion and damage of elements of said stacked gate edge during field oxide etching of a self-aligned-source (SAS) region comprising:

(a) providing a silicon wafer having a stacked gate edge positioned over alternating regions of field oxide and silicon active area;

(b) depositing a conformal silicon enriched silicon oxynitride layer over said silicon wafer;

(c) depositing and patterning a photoresist mask to expose a SAS region;

(c) etching said regions of field oxide in said SAS region; and (d) performing a source implant whereby, during etching, the silicon enriched silicon oxynitride layer protects the edges of the stacked gate from erosion.

16. The method of claim 15 wherein said conformal silicon enriched silicon oxynitride layer is deposited by PECVD at a temperature of between about 320° C. and 380° C. and pressure of between about 3,000 and 8,000 mTorr, using precursors $SiH_4$ at a flow rate of between about 80 and 90 SCCM and $N_2O$ at a flow rate of between about 80 and 100 SCCM in a helium carrier gas at a flow rate of between about 2,000 and 2,500 SCCM.

17. The method of claim 15 wherein said silicon enriched silicon oxynitride layer is between about 200 and 1,000 Angstroms thick.

18. The method of claim 15 wherein said silicon enriched silicon oxynitride layer contains a silicon oxide portion in its base.

* * * * *